US008204236B2

(12) United States Patent
Mainz

(10) Patent No.: US 8,204,236 B2
(45) Date of Patent: Jun. 19, 2012

(54) PROTECTION PROCEDURE FOR SPEAKER SYSTEMS

(75) Inventor: Alexander Mainz, Kronach (DE)

(73) Assignee: Lear Corporation, Southfield, MI (US)

( * ) Notice: Subject to any disclaimer, the term of this patent is extended or adjusted under 35 U.S.C. 154(b) by 1321 days.

(21) Appl. No.: 11/759,461

(22) Filed: Jun. 7, 2007

(65) Prior Publication Data

US 2008/0044037 A1 Feb. 21, 2008

(30) Foreign Application Priority Data

Aug. 21, 2006 (DE) ......................... 10 2006 039 162

(51) Int. Cl.
*H03G 11/00* (2006.01)

(52) U.S. Cl. ............................ 381/55; 381/94.8; 381/96

(58) Field of Classification Search .................... 381/82, 381/120, 96, 310, 59, 55, 56, 58, 107, 108, 381/94.8, 150; 330/284
See application file for complete search history.

(56) References Cited

U.S. PATENT DOCUMENTS 5,366,376 A * 11/1994 Copperman et al. ............ 434/69
5,617,480 A 4/1997 Ballard et al.
5,815,584 A 9/1998 Whitecar et al.
6,028,944 A * 2/2000 Markow et al. ............... 381/120
6,058,195 A * 5/2000 Klippel ........................... 381/96
6,389,146 B1 5/2002 Croft, III
6,477,255 B1 11/2002 Yoshida et al.
6,983,052 B2 1/2006 Kemmerer et al.
2002/0071572 A1* 6/2002 Moertel .......................... 381/82
2003/0219137 A1 11/2003 Fincham
2003/0228020 A1 12/2003 Lentinturier et al.
2004/0037440 A1 2/2004 Croft, III
2004/0178852 A1* 9/2004 Neunaber ..................... 330/284
2005/0147057 A1 7/2005 LaDue
2005/0152562 A1 7/2005 Holmi et al.
2005/0280524 A1 12/2005 Boone et al.
2006/0109992 A1* 5/2006 Roeder et al. ................. 381/310
2008/0025529 A1* 1/2008 Keohane et al. .............. 381/104

FOREIGN PATENT DOCUMENTS

DE 10052896 A1 5/2002
DE 10321986 A1 12/2004

OTHER PUBLICATIONS

Office Action from German Patent Office, mailed Feb. 12, 2007, 4 pages.

* cited by examiner

*Primary Examiner* — Vivian Chin
*Assistant Examiner* — Friedrich W Fahnert
(74) *Attorney, Agent, or Firm* — Brooks Kushman P.C.

(57) ABSTRACT

Protection method and system for use with speaker systems. The method and system being suitable for use in any number of environments to protect speakers from overload and other undesirable operating conditions. The method and system optionally being suitable for use in maintaining system sound integrity while protecting the speakers from overload and/or other undesirable operating conditions.

6 Claims, 1 Drawing Sheet

PROTECTION PROCEDURE FOR SPEAKER SYSTEMS

CROSS-REFERENCE TO RELATED APPLICATIONS

This application claims foreign priority benefits under 35 U.S.C. §119(a)-(d) to DE 10 2006 039 162.4, filed Aug. 21, 2006, which is hereby incorporated by reference in its entirety.

BACKGROUND OF THE INVENTION

1. Field of the Invention

The present invention relates to speakers systems of the type having speakers for generating sound waves as a function of signals carried over one or more different channels.

2. Background Art

As one skilled in the art will appreciate, speakers generate sound waves as a function of signals carried over one or more channels. Typically, a single channel is associated with a single speaker so that speakers can be separately controlled to generate the same or different sounds (e.g. mid-range loudspeakers, tweeters, woofers, etc.).

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
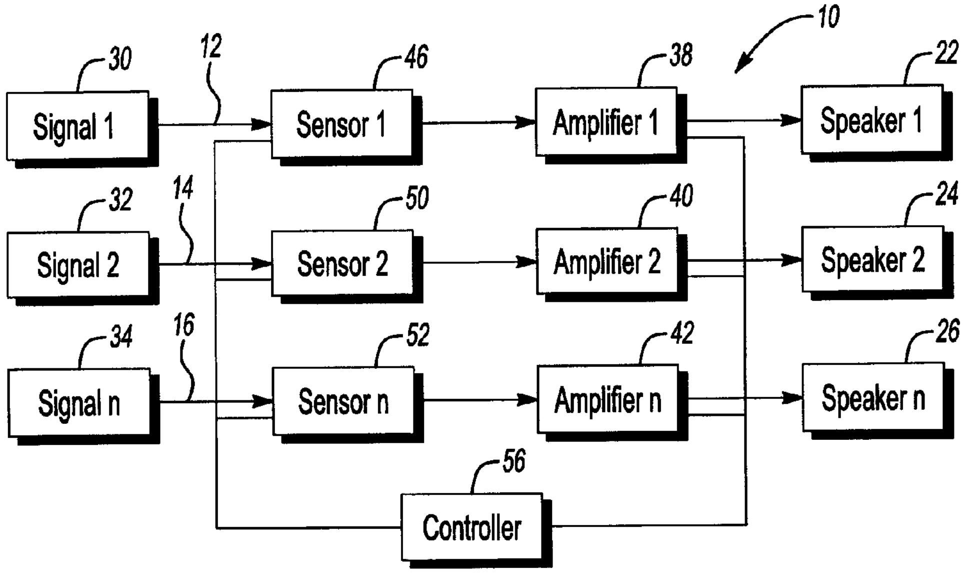
FIG. 1 illustrates an audio system in accordance with one non-limiting aspect of the present invention.

FIG. 1 illustrates an audio system 10 in accordance with one non-limiting aspect of the present invention. The system 10 generally illustrates a multi-channel speaker environment where different speaker signals are carried over a number of channels 12-16 to a corresponding number of output elements 22-26 (hereinafter referred to as speakers).

A number of signals sources 30-34 may be included to generate the signals. The signals may be delivered to the speakers 22-26 over different channels 12-16. Optionally, amplifiers 38-42 may be associated with the channels 12-16 to amplify the signals associated therewith. The amplifiers 38-42 may be of a controllable type having characteristics sufficient to increase and/or decrease signals power levels, such as class D amplifiers having properties sufficient to power adjust with all its power stage elements alternating between on and off states.

The system 10 may further include a number of sensors 46-50 for sensing signal activity over one or more of the channels 12-16. The sensors 46-50 may comprise any sensor suitable for sensing signal traffic and parameters associated therewith, such as but not limited to signal power levels. Optionally, at least one sensor 46-50 may be associated with each channel 12-16 so that the operations of each channel 12-16 may be monitored.

A controller 56 may be included to interpret the sensor signals. The controller 56 may include any number and type of processors, memories, or other features to facilitate operations in accordance with the present invention. The controller 56 may be configured to differentiate signals from each of the sensors 46-50 so that separate or independent processing of the signals may occur for each corresponding channel 12-16 and/or sensor 46-50.

In this manner, the present invention is able to monitor and process signals carried in a multi-channel environment. As described below in more detail, the controller 56 may be configured to adjust the signals as a function of the sensor signals so as to control system performance, such as but not limited to controlling operation of the amplifiers 38-42 associated therewith.

The sensors 46-50 may be positioned at an upstream location relative to the amplifiers 38-42 such that the controller 56 processes the signal parameters before the amplifiers 38-42 modify the sound signals. Optionally, the sensors 46-52 may be located downstream of the amplifiers 38-42 and configured to provide signal correction, as opposed to the amplifiers 38-42 providing signal correction, such as but not limited to permitting signal adjustments downstream of the amplifiers 38-42.

The controller 56 may be programmable with instructions for controlling signal levels as a function of signal and speaker operating parameters. For example, the controller 56 may be programmed with desired operation characteristics for each of the speakers 22-26. The controller 56 may monitor speaker activity and adjust signal levels as a function thereof, such as but not limited to controlling the amplifiers 38-42 to adjust signal power levels so as to reduce or control wear and tear on the speakers 22-26.

The controller 56 may be programmed to implement the desired signal control through instructions or other communications with the amplifiers 38-42. Optionally, the controller 56 may separately or commonly communicate with the amplifiers 38-42 such that the amplifiers 38-42 may be separately or commonly controlled. For exemplary purposes, controls imparted by the controller 56 are predominately described with respect to controlling amplifier operations. The present invention, however, is not so limited and fully contemplates controlling any number of other elements, features, or devices associated with operations of the speakers and not just signal amplifiers.

The audio system 10 may be suitable for use with any number of signals sources 30-34, such as but not limited to signal sources commonly found in radio tuners, multimedia players, automobiles, home entertainment systems, theatres, etc. The present invention contemplates its application and use in any number of environments where one or more speakers may be used to generate sound waves. The present invention is not intended to be limited to any particular environment or application.

Figure 2:
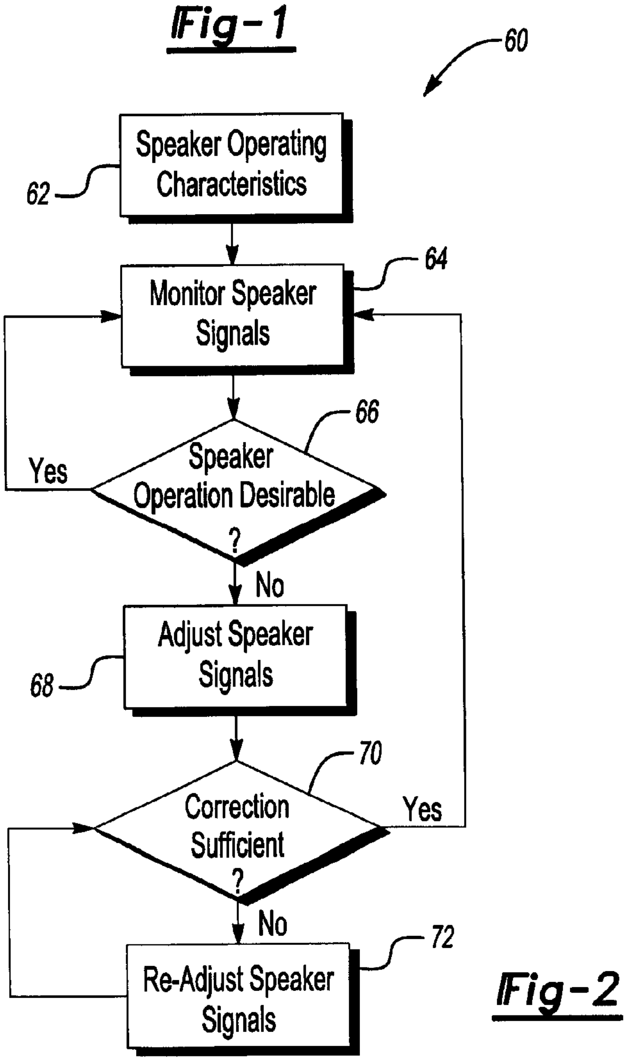
FIG. 2 illustrates a flowchart of a method of controlling speaker performance in accordance with one non-limiting aspect of the present invention.

FIG. 2 illustrates a flowchart 60 of a method of controlling speaker performance in accordance with one non-limiting aspect of the present invention. The method may be embodied in a computer-readable medium of the controller or some other element in the system in a self-executing or other logical operating manner so as to direct, control, and otherwise execute operations within the scope and contemplation of the present invention. The flowchart illustrates multiple, sequential steps, however, the present invention is not so limited and fully contemplates any step order and any number of more or less steps.

Block 62 relates to determining speaker operating characteristics. The speaker operating characteristics may be defined according to any number of operating characteristics of the speakers, such as but not limited to speaker power levels and other variable operating characteristics. The operating characteristics may take into consider speaker usage and other parameters such that different operation characteristics may be defined as a function of speaker usage and history.

Optionally, multiple sets of operating conditions are associated with different types of speakers. For example, a midrang speaker may have a particular set of operating characteristics and a woofer or tweeter may have a similarly different set of operating characteristics. The controller may be programmed to differentiate between the speakers and speakers signals so as to associated the proper operating characteristics with the same.

Block 64 relates to monitoring the speaker signals with the signal sensors or with some other element of the system. Any number of signal operating characteristics may be monitored and correlated with the speaker operating characteristics, such as but not limited to signal power levels, exposure (duration), voltage spikes, etc. Optionally, the controller may be configured to continuously monitor to the speaker signals for use in assessing the speaker signal influence on the desired speaker operation conditions determined above in Block 62.

Block 66 relates to determining whether the speaker operating conditions are desirable. This determination may be made by the controller as a function of the speaker signals sensed with the sensors. The controller may be configured to simultaneously process the different speakers signals so as to determine whether any one or more of the speakers channels are carrying signals at levels unsuitable or otherwise undesirable for use with the current operating characteristics of the corresponding speaker.

If the operating conditions of all of the speakers are within a desirable operating range, Block 64 may be returned to and the associated monitoring may be continued. Optionally, the continued monitoring may correspond with changing operating characteristics for one or more of the speakers, such as if the operating characteristics determined in Block 62 specify time-variable conditions or the like.

If the operating conditions of one or more of the speakers art outside of the desirable operating conditions, such as but not limited to an overload condition, Block 68 may be reached. The overload or other non-desirable condition may correspond with the speaker signals being above a predefined threshold for a particular period of time or some other set of operating conditions indicating a need to take action.

Block 68 may corresponding with adjusting the speaker signals so as to compensate for the undesirable operation of one or more of the speakers. This may include, for example, raising or lowing the speaker signal power levels with amplifier control. In more detail, if the speakers are under performing or could otherwise perform at a better or higher power level, the signal power levels may be raised. Likewise, if the speakers are operating above or close to desired limits, the speaker power levels may be lowered.

Optionally, when the power levels or other characteristics of the speaker signals are changed, and the changes influence sound quality or other user determinable characteristics of the speakers, compensation or adjustments may be made to the other speaker signals so as to correlate their operation with the operation of the speaker(s) trigger the adjusts. This can be helpful in coordinating output quality of all the speakers, such as but not limited to producing an equal output influence across all the speakers. This may require normalizing the signal adjustment for each channel.

For example, and without intending to limit the scope and contemplation of the present invention, different speakers operating on different channels may generate different sound waves. The controller may separately adjust each of the channel signals so as to correct the undesirable operation of the one or more speakers and to correlated such adjustments with the relative operation of the other speakers so that a listener is able to hear the same or substantially similar sound quality.

If the signal power level is adjusted to correct operations of one or more of the speakers, the signal power levels of the other speakers may be similarly adjusted so that the relative power output levels of the speakers remains constant. This allows the listener to hear the same or substantially similar sound quality at a decreased power levels. This method of control may be more advantageous than adjusting the signal levels of only one of the speakers as such adjustments tend to negatively influence the overall sound quality of the system.

It may be more desirable to maintain sound quality at lower sound levels than to have one or more of the speakers operation at sound levels relatively greater than the other speakers. Similar adjustments may be made to increase sound levels if all of the speaker can support sound increases such that system output may be increased in proportion to the weakest speaker, thereby maximizing system performance while protecting speaker operations.

Block 70 relates to determining whether the speaker signal adjustments were sufficient to return or start to return the speakers to desirable operating conditions. The speaker performance can dynamically change as a function of signal power levels and signal exposure such that changes in either condition may return or start to return the speaker(s) to desirable performance bounds.

Block 72 relates to re-adjusting the signal adjustments to correspond with the trend generated with the previous adjustment. The re-adjustment does not necessarily require adjusting the previous adjustment if it is desirable to keep the associated adjustment response. Likewise, the re-adjustment may include increasing or decreasing the influence of the previous adjustment with corresponding changes to the speaker signals, such as to speed up or slow down the changes in speaker operating conditions and/or as a function of elapse time since the last adjustment.

Once the undesirable operating speaker(s) is returned to desirable or substantially desirable operating conditions, the speaker signal adjustments may be terminated and Block 64 returned. This generally corresponds with permitting the listener to freely adjust speaker performance without the controller overriding the corresponding speaker signals in order to compensate for undesirable speaker operations.

While the foregoing is predominately described with respect to increasing or decreasing speaker power levels, the present invention is not so limited and fully contemplates adjusting any number of other speaker signal operating characteristics.

One non-limiting aspect of the present invention relates to a method and system for maximizing performance of a multichannel speaker system while protecting speaker operations. This, as noted above, may also be done in such a manner as to maintain sound quality of the overall system such that corrections may be made without jeopardizing relative sound quality between the different speakers, as signal compensation may be normalized across each channel so as to unify the adjustment to each channel.

The system of the present invention may be particularly suitable for use with vehicle based audio systems having coil speakers that must operate a relative high voltage for a prolonged period of time. For example, the present invention contemplates one application where the speakers may be required to maintain sound integrity after being exposed to testing conditions where the speaker signals are driven at −/+28V at 40 degrees Celsius for 100 hours. The present invention can be helpful in maintaining sound integrity after such testing by limiting power delivered to the speakers in such a manner that sound quality is maintained, i.e., by normalizing power to each speaker as a function of the weakest or most overdriven speaker.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A speaker system, the system comprising:

a number of speakers configured to generate sound waves as a function of speaker signals communicated thereto;

one or more adjustment elements configured to adjust the speaker signals;

a controller configured to control the adjustment elements in such as a manner as to protect the speakers from overload conditions without interrupting sound quality associated with the speaker system, wherein the controller identifies an overload percentage for one of the speakers when experiencing an overload condition, the overload percentage indicating a percentage by which the corresponding speaker signal is to be decreased in order to prevent the overload condition, wherein the controller controls the one or more adjustment elements to decrease each of the speaker signals by the overload percentage in order to protect the speakers, wherein a first portion of the speaker signals are powered at a level greater than a second portion of the speaker signals such that an amount of decrease is greater for the first portion of the speaker signals than the second portion of the speaker signals; and in the event two or more speakers are experience overload conditions, the controller determining the overload percentage for each of the two or more speakers and decreasing each of the speakers signals according to the greatest one of the overload percentages.

2. The system of claim 1 further comprising a number of sensors in communication with the speaker signals and controller, the sensors configured to sense speaker signals and to communicate operating characteristics associated therewith to the controller for use in controlling the adjustment elements.

3. The system of claim 2 wherein each channel includes a sensor and amplifier to facilitate protecting against the overload condition.

4. The system of claim 1 wherein the controller is configured to adjust speakers signals to each of the speakers as a function of operating characteristics specified for each speaker.

5. The system of claim 1 wherein the adjustments elements are class D amplifiers.

6. The system of claim 1 further comprising a number of 28 volt signals sources for generating the speakers signals.

* * * * *

UNITED STATES PATENT AND TRADEMARK OFFICE

CERTIFICATE OF CORRECTION

PATENT NO. : 8,204,236 B2
APPLICATION NO. : 11/759461
DATED : June 19, 2012
INVENTOR(S) : Alexander Mainz It is certified that error appears in the above-identified patent and that said Letters Patent is hereby corrected as shown below:

Column 6, Line 13, Claim 1:

After “two or more speakers” delete “are”.

Signed and Sealed this
Second Day of October, 2012

David J. Kappos
*Director of the United States Patent and Trademark Office*